(12) United States Patent
Bao et al.

(10) Patent No.: US 9,865,706 B2
(45) Date of Patent: Jan. 9, 2018

(54) INTEGRATED PROCESS AND STRUCTURE TO FORM III-V CHANNEL FOR SUB-7NM CMOS DEVICES

(71) Applicant: Applied Materials, Inc., Santa Clara, CA (US)

(72) Inventors: Xinyu Bao, Fremont, CA (US); Chun Yan, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 13 days.

(21) Appl. No.: 15/277,394

(22) Filed: Sep. 27, 2016

(65) Prior Publication Data

US 2017/0133224 A1 May 11, 2017

Related U.S. Application Data

(60) Provisional application No. 62/281,760, filed on Jan. 22, 2016, provisional application No. 62/252,884, filed on Nov. 9, 2015.

(51) Int. Cl.
| | |
|---|---|
| *H01L 21/00* | (2006.01) |
| *H01L 29/66* | (2006.01) |
| *H01L 21/02* | (2006.01) |
| *H01L 29/06* | (2006.01) |
| *H01L 29/423* | (2006.01) |
| *H01L 29/786* | (2006.01) |

(52) U.S. Cl.
CPC .. *H01L 29/66742* (2013.01); *H01L 21/02057* (2013.01); *H01L 21/02461* (2013.01); *H01L 21/02463* (2013.01); *H01L 21/02546* (2013.01); *H01L 21/02549* (2013.01); *H01L 29/0673* (2013.01); *H01L 29/42392* (2013.01); *H01L 29/66522* (2013.01); *H01L 29/78681* (2013.01); *H01L 29/78696* (2013.01)

(58) Field of Classification Search
None
See application file for complete search history.

(56) References Cited

U.S. PATENT DOCUMENTS

| | | | | |
|---|---|---|---|---|
| 2003/0193065 A1* | 10/2003 | Fried | ........... | H01L 29/42384 257/328 |
| 2008/0286667 A1* | 11/2008 | Okita | ........... | G03F 7/70525 430/22 |
| 2010/0129982 A1* | 5/2010 | Kao | ........... | H01L 27/11521 438/430 |
| 2016/0365416 A1* | 12/2016 | Metz | ........... | H01L 29/66522 |

* cited by examiner

*Primary Examiner* — Reema Patel
(74) *Attorney, Agent, or Firm* — Patterson + Sheridan LLP

(57) ABSTRACT

Embodiments described herein generally relate to methods and structures for forming precise fins comprising Group III-V elements on a silicon substrate. A buffer layer is deposited in a trench formed in the dielectric material on a substrate. An isolation layer is then deposited over the buffer layer. A portion of the isolation layer is removed allowing for a precisely sized Group III-V channel layer to be deposited on the isolation layer.

20 Claims, 4 Drawing Sheets

INTEGRATED PROCESS AND STRUCTURE TO FORM III-V CHANNEL FOR SUB-7NM CMOS DEVICES

CROSS-REFERENCE TO RELATED APPLICATIONS

This application claims benefit of U.S. Provisional Patent Application No. 62/252,884, filed Nov. 9, 2015, and U.S. Provisional Patent Application No. 62/281,760, filed Jan. 22, 2016, each of which is herein incorporated by reference.

BACKGROUND

Field

Embodiments of the present disclosure generally relate to manufacture of semiconductor devices. More specifically, methods are described for forming channels comprising Group III-V elements on a silicon substrate.

Description of the Related Art

Group III-V elements may be advantageous in certain applications for silicon-based devices. For example, Group III-V elements may serve as a channel, or fin, material for sub-7 nanometer (nm) complementary metal-oxide semiconductor (CMOS) devices due to the low contact resistance, superior electron mobility and lower operation voltage. However, there are major challenges of growing III-V material on silicon, such as lattice mismatch, valence difference, thermal property differences, conductivity differences, and anti-phase defects.

Metamorphic buffers are commonly used to reduce lattice mismatch and anti-phase defects. Buffer layer materials are typically selected to provide a transition in lattice structure between a substrate material and a channel material. Growth of the buffers in narrow trenches is effective to reduce anti-phase defects, which becomes increasingly important as channel dimensions decrease. In some architectures, the channel (such as indium gallium arsenide (InGaAs)) stacks on top of the buffer layer (materials with lattice grading such as gallium arsenide (GaAs), indium phosphide (InP), etc.) and electrical insulation layer (wide band gap material such as indium aluminum arsenide (InAlAs)). However, it is difficult to obtain uniform channel thickness due to trench depth and critical dimension (CD) variation, and growth uniformity drift across the wafer, especially as device sizes are becoming smaller and smaller. This lack of uniformity results in decreased device yield.

Thus, there is a need in the art for a process and apparatus to form precise III-V channel layers for devices.

SUMMARY

Embodiments described herein generally provide a method of processing a substrate. The method includes depositing a buffer layer in a trench formed in a dielectric material on the substrate. An isolation layer may be deposited over the buffer layer in the trench. The trench may be overfilled with the isolation layer. A portion of the isolation layer may be removed to form a second trench. A channel material may be deposited over the isolation layer in the trench. The second trench may be overfilled with the channel material to form a channel layer and an overfill. The substrate may be planarized to remove the overfill. The dielectric material may be etched to expose the channel layer and at least a portion of the isolation layer.

In another embodiment, a method is provided. The method includes depositing a dielectric material on a substrate. A trench may be formed in the dielectric material. A buffer layer may be deposited in the trench. An isolation material may be deposited over the buffer layer in the trench to form an isolation layer and a first overfill. The substrate may be planarized to remove the first overfill. A portion of the isolation layer may be etched to form a second trench. A channel material may be deposited over the isolation layer in the second trench to form a channel layer and a second overfill. The substrate may be planarized to remove the second overfill. The dielectric material may be etched to expose the channel layer and at least a portion of the isolation layer.

In yet another embodiment, a method is provided. The method includes disposing a substrate having a dielectric material with at least one trench formed thereon in a first chamber. In the first chamber, a buffer layer may be formed in the trench. In the first chamber, an isolation material is formed over the buffer layer in the trench to form an isolation layer and a first overfill. The substrate may be transferred to a second chamber. In the second chamber, the substrate is planarized to remove the first overfill. The substrate may then be transferred to a third chamber. In the third chamber, a portion of the isolation layer is removed to form a second trench. The substrate may then be transferred to the first chamber. In the first chamber, a channel material is added over the isolation layer in the second trench to form a channel layer and a second overfill. The substrate may then be transferred to the second chamber. In the second chamber, the substrate is planarized to remove the second overfill. The substrate may then be transferred to the third chamber. In the third chamber, the dielectric material is removed to expose the channel layer and at least a portion of the isolation layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein generally relate to methods and structures for forming precise fins comprising Group III-V elements on a silicon substrate. Variation in layer formation processes, and thickness of layers formed, is managed using overfill and removal processes that result in uniform channel thickness. A buffer layer is formed in a trench formed in the dielectric material on a substrate. An isolation layer is then deposited over the buffer layer. In a conventional process, remaining trench depth after formation of the buffer and isolation layers varies widely, resulting in widely varying channel thickness. In the embodiments described herein, isolation material is added to the trench on the buffer layer to form an isolation layer and a first overfill. The first overfill is removed, and then a portion of the isolation layer is uniformly removed allowing for a uniform trench depth for forming the channel, and thus a precisely sized Group III-V channel layer formed on the isolation layer.

Figure 1:
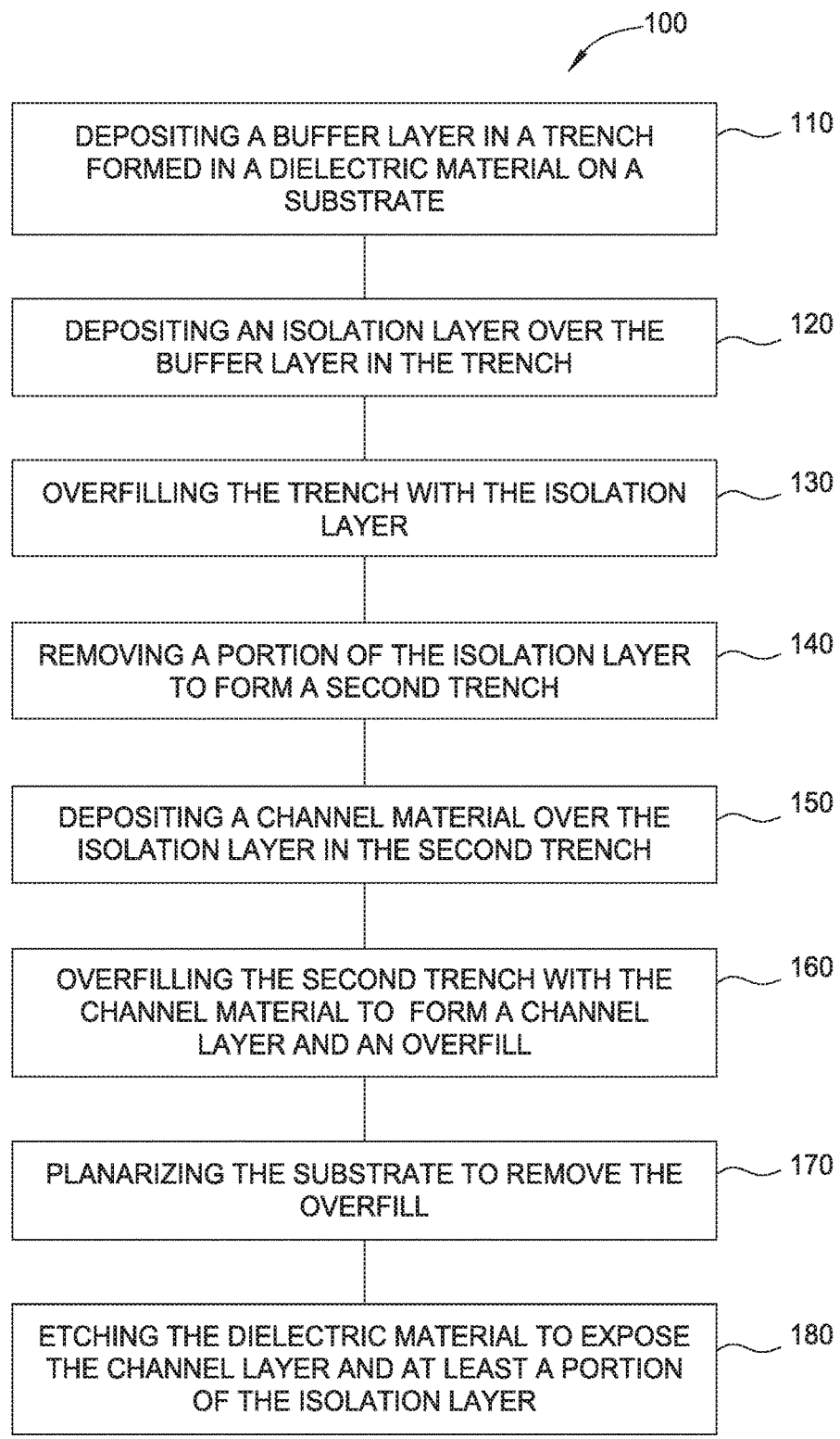
FIG. 1 is a flow diagram summarizing a method according to one embodiment described herein.

FIG. 1 is a flow diagram summarizing a method 100 for forming precise channels comprising Group III-V elements on a silicon substrate. FIGS. 2A-2H depict stages of fabrication of a device structure in accordance with the method 100 of FIG. 1. The method 100 is described below in accordance with stages of formation of precise channels comprising Group III-V elements on a substrate as illustrated in FIGS. 2A-2H.

Figure 2A:
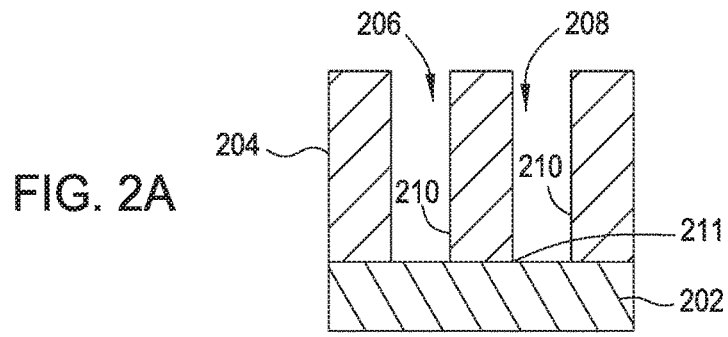
FIGS. 2A-2H depict stages of fabrication of a device structure in accordance with the method of FIG. 1.

As shown in FIG. 2A, a dielectric material 204 is deposited on a substrate 202. Trenches 206, 208 are formed in the dielectric material 204. The substrate 202 may be a silicon-containing substrate. The substrate 202 may further comprise germanium (Ge), carbon (C), boron (B), phosphorus (P), or other known elements that may be co-grown, doped and/or associated with silicon materials. The substrate 202 may be part of a device, such as a CMOS device. The CMOS device may be sub-7 nm. In one embodiment, the CMOS device may be 3 nm. In another embodiment, the CMOS device may be 5 nm. Other devices, such as fin shaped field effect transistors (FinFETs) or the like may be used with the inventive methods provided herein.

The dielectric material 204, such as a shallow trench isolation (STI) oxide, may comprise one or more of silicon oxide (SiO), silicon dioxide ($SiO_2$), silicon nitride (SiN), silicon oxynitride (SiON) or other suitable materials that may be used to form a dielectric material. The dielectric material 204 may be deposited by various deposition processes. For example, the dielectric material 204 may be deposited by a chemical vapor deposition (CVD) process, which may be plasma enhanced.

The trenches 206, 208 in the dielectric material 204 on the substrate 202 have sidewalls 210, which contact the substrate 202 at a contact region 211. The trenches 206, 208 may be formed by patterning the dielectric material 204, using for example an etching process, to achieve the desired trench characteristics. Suitable methods of etching the dielectric material 204 include anisotropic dry etching or an in-situ dry clean process of the substrate 202. In one embodiment, the trenches 206, 208 may be formed by exposing the plurality of sidewalls 210 to an ammonia ($NH_3$) or nitrogen trifluoride ($NF_3$) remote plasma at room temperature through a pattern mask and subsequently heating the substrate to about 100° C. In another embodiment, the trenches 206, 208 may be formed using a self-aligned double or quadruple patterning process. In additional embodiments, other methods of etching may be used to form the trenches 206, 208. Generally, etch processes associated with embodiments provided herein may be performed at temperatures between about 30° C. and about 750° C. After the trenches 206, 208 have been formed in the dielectric material 204, the trenches 206, 208 may be optionally cleaned.

Figure 2B:
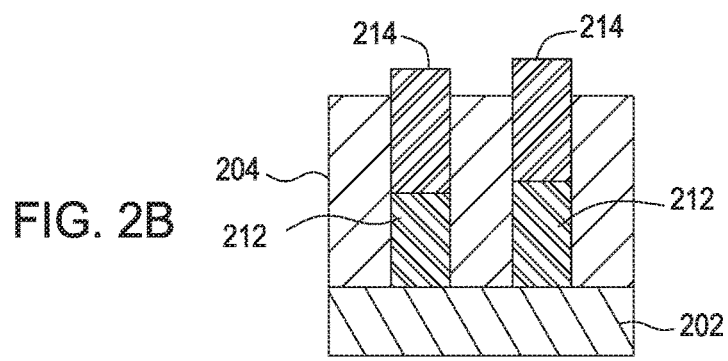

At operation 110 of FIG. 1, as shown in FIG. 2B, a buffer layer 212 may be deposited in the trenches 206, 208. The buffer layer 212 may comprise a material that has a good lattice match to the channel layer, such as a III-V material. In one embodiment, the buffer layer 212 comprises GaAs. In another embodiment, the buffer layer 212 comprises multiple materials, such as GaAs and InP.

The buffer layer 212 may be deposited by any suitable deposition method, such as chemical vapor deposition (CVD), epitaxial deposition, or any other suitable deposition method. The one or more Group III and/or Group V source materials may be in any suitable state, such as a solid or liquid that may be sublimed or vaporized, respectively, or in a gaseous state. The source materials may be metal organic precursors or the like. The buffer layer 212 may be deposited to a thickness of between about 100 nm to about 200 nm. In use, deposition of the buffer layer 212 results in the crystal defects of the device being terminated on the sidewalls 210 rather than being propagated upwards towards a targeted channel region.

At operation 120 of FIG. 1, as shown in FIG. 2B, an isolation layer 214 is deposited over the buffer layer 212 in the trenches 206, 208. The isolation layer 214 may be deposited on and in contact with the buffer layer 212. The isolation layer 214 may comprise a material having a wide band gap. In other words, the isolation layer 214 may comprise a material having a band gap of at least 1 electronvolt (eV). In one embodiment, the isolation layer 214 comprises InP, which has a band gap of 1.29 eVs. In another embodiment, the isolation layer 214 comprises AlAs. In an additional embodiment, the isolation layer 214 comprises InGaAs. Additional isolation materials include, but are not limited to, gallium phosphide (GaP), indium aluminum arsenide (InAlAs), and aluminum phosphide (AlP). The isolation layer 214 may be doped.

The isolation layer 214 may be deposited by any suitable deposition method, such as chemical vapor deposition (CVD), epitaxial deposition, or any other suitable deposition method. The isolation layer 214 may be deposited to a thickness less than the thickness of the buffer layer 212. In one embodiment, the isolation layer 214 has a thickness of between about 10 nm and about 200 nm.

At operation 130, the trench is overfilled with the isolation layer 214. The thickness of the buffer layer 212 in trench 206 may be different than the thickness of the buffer layer 212 in trench 208 depending on lack of uniformity across the surface of the substrate 202. For the same reasons, the thickness of the isolation layer 214 in trench 206 may be different than the thickness of the isolation layer 214 in the trench 208.

Figure 2C:
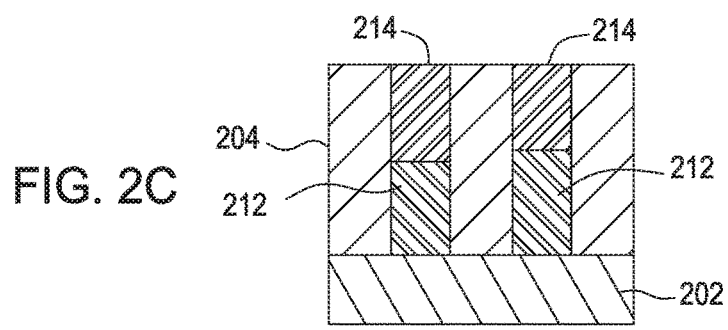

As shown in FIG. 2C, the substrate 202 may be optionally planarized such that the top of the isolation layer 214 is flush with the top of the dielectric material 204. Planarization may occur through a chemical-mechanical polishing (CMP) process.

Figure 2D:
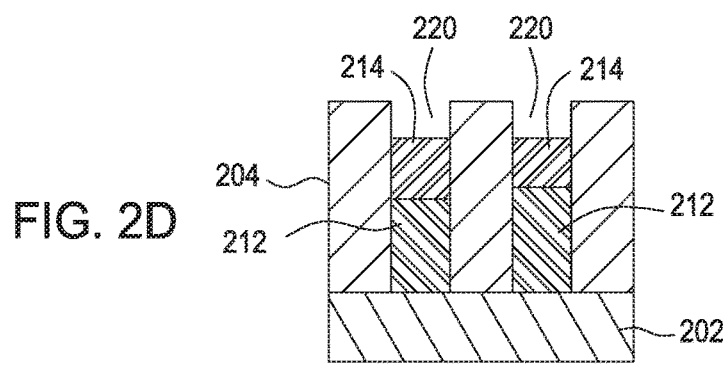

To improve uniformity in the buffer layer 212 and isolation layer 214 thicknesses, a portion of the isolation layer 214 is removed at operation 140 of FIG. 1, as shown in FIG. 2D, such that the isolation layer 214 is recessed below the top surface of the dielectric material 204. In other words, a portion of the isolation layer 214 is removed to form a second trench 220. Removal of a portion of the isolation layer 214 may occur through an etching process. Suitable methods of etching the isolation layer 214 include any suitable etching process, such as anisotropic dry etching. In one embodiment, argon (Ar), hydrogen (H), and/or chlorine (Cl) may be used as precursors for etching the isolation layer 214. The precursor(s) functions to volatilize the isolation layer 214 such that a portion may be removed. In another embodiment, other suitable etching processes may be used to recess the isolation layer 214. The isolation layer 214 should be recessed to a distance below the top surface of the dielectric material 204 that is equal to the targeted channel thickness. In one embodiment, the isolation layer 214 is recessed below the top surface of the dielectric material 204 at a distance of between about 20 nm to about 60 nm.

Figure 2E:
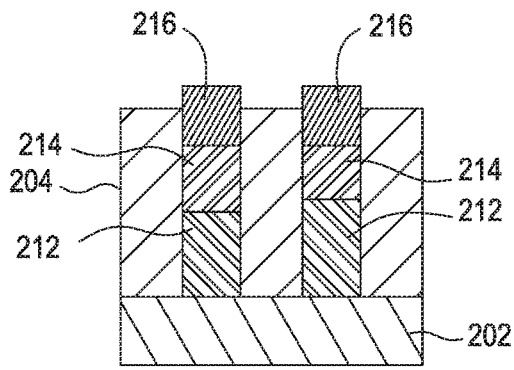

At operation 150 of FIG. 1, as shown in FIG. 2E, a channel material 216 is deposited over the isolation layer 214 in the second trench 220. The channel material 216 may be deposited on and in contact with the isolation layer 214. The channel material 216 may comprise any combination of at least a Group III element and a Group V element. In one embodiment, the channel layer 216 comprises indium gallium arsenide (InGaAs). In another embodiment, the channel layer 216 may comprise aluminum gallium arsenide (AlGaAs), indium gallium antimonide (InGaSb), indium arsenide (InAs), gallium antimonide (GaSb), or indium antimonide (InSb). In further embodiments, the channel material 216 may comprise a Group III-Group V material having high electron mobility and a good crystallographic structure. The channel layer 216 may be doped.

The channel material 216 may be deposited by any suitable deposition method, such as chemical vapor deposition (CVD), epitaxial deposition, or any other suitable deposition method. The channel layer 216 may be deposited to a target thickness. In one embodiment, the channel layer 216 has a thickness of between about 10 nm and about 60 nm.

Figure 2F:
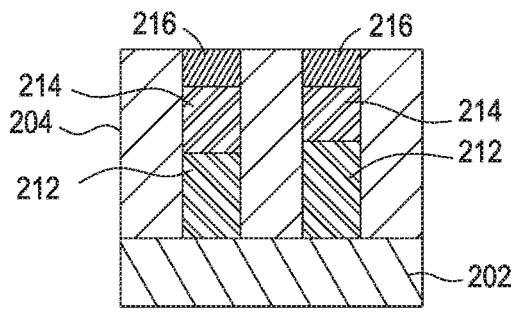

At operation 160, the second trench 220 is overfilled with the channel material 216 to form a channel layer and an overfill. At operation 170 of FIG. 1, as shown in FIG. 2F, the substrate 202 may be planarized such that the top of the channel layer 216 is flush with the top of the dielectric material 204. Planarization may occur through a chemical-mechanical polishing (CMP) process.

Figure 2G:
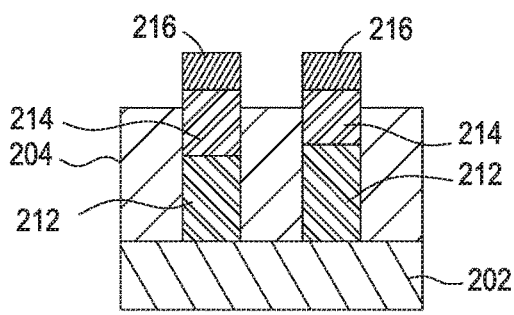

At operation 180 of FIG. 1, as shown in FIG. 2G, the dielectric material 204 may be etched to expose the channel layer 216 and at least a portion of the isolation layer 214. Suitable methods of etching the dielectric material 204 include anisotropic dry etching or SiConi™ etching. In one embodiment, the dielectric material 204 may be etched by exposing the dielectric material 204 to an ammonia (NH₃) or nitrogen trifluoride (NF₃) remote plasma at room temperature and subsequently heating the substrate to about 100° C. In additional embodiments, other methods of etching may be used to etch the dielectric material 204.

Figure 2H:
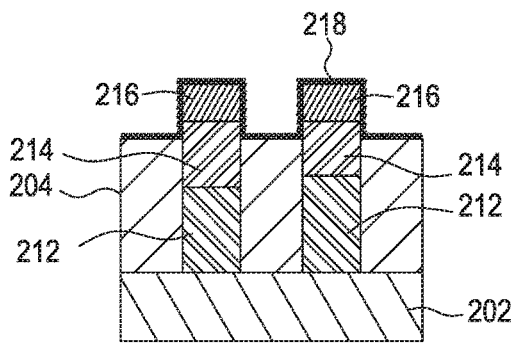

As shown in FIG. 2H, the device may be cleaned and a second dielectric material 218 may be optionally deposited on and in contact with the exposed channel layer 216, the exposed portion of the isolation layer 214, and the dielectric material 204. The second dielectric material 218 may comprise a dielectric material with a high dielectric constant (high k dielectrics). Examples of high k dielectrics include, but are not limited to, hafnium silicate (HfSiO₄), zirconium silicate (ZrSiO₄), hafnium dioxide (HfO₂), and zirconium dioxide (ZrO₂).

Figure 3:
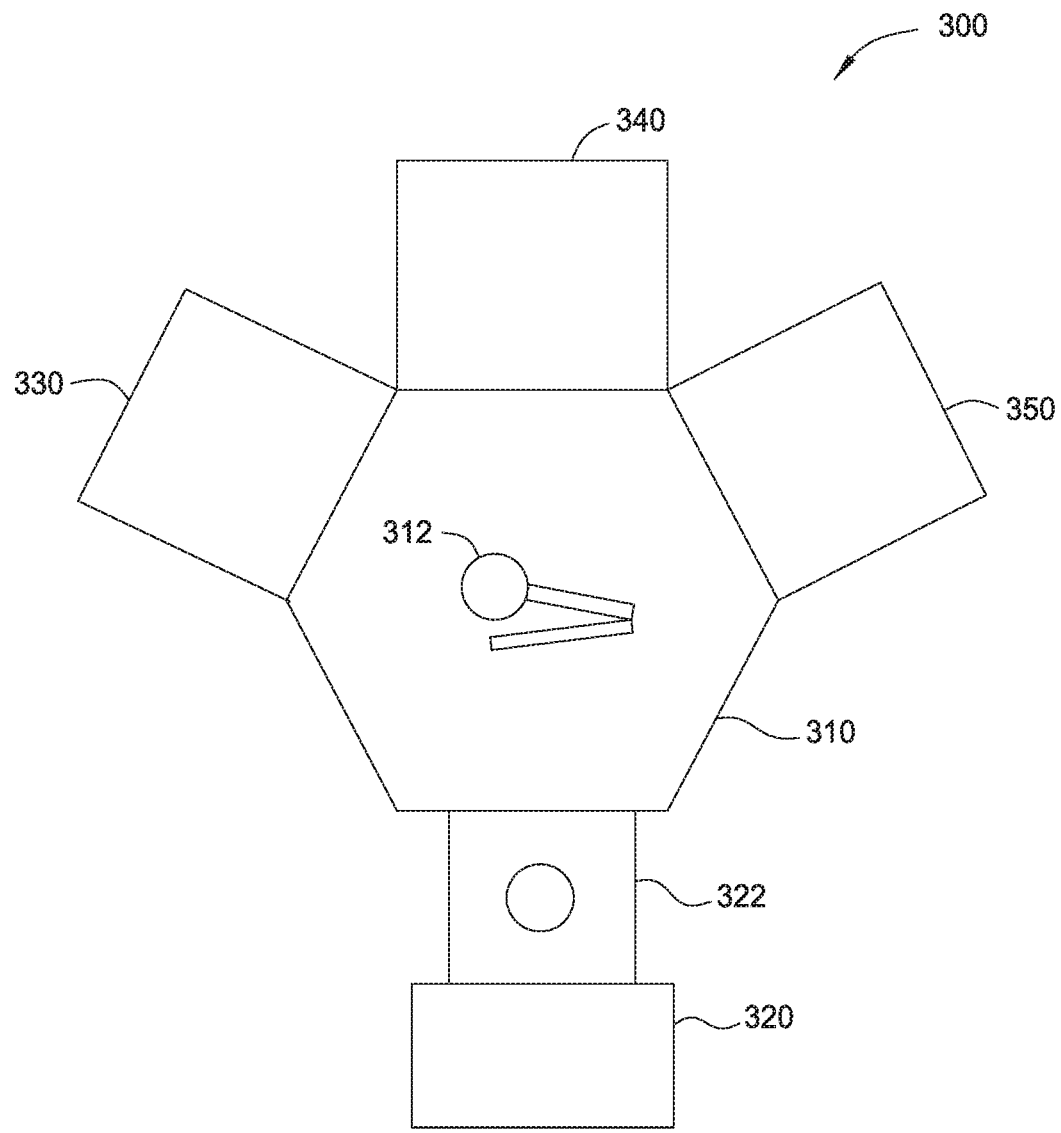
FIG. 3 is a schematic view of an apparatus for performing a method according to one embodiment described herein.

FIG. 3 is a schematic view of an apparatus 300 for performing a method according to one embodiment described herein. More specifically, the apparatus 300 is a cluster tool for fabricating semiconductor devices according to the methods described above. At the center of the apparatus 300 is a transfer chamber 310. Within the transfer chamber 310 is a wafer transferring mechanism 312. The wafer transferring mechanism 312 transfers a wafer from one of the first, second, or third process chambers, 330, 340, and 350, respectively, to the load lock chamber 320 and vice versa. The first, second, and third process chambers, 330, 340, and 350, are connected to the transfer chamber 310. The load lock chamber 320 is connected to the transfer chamber 310 through a wafer alignment chamber 322. In a preferred embodiment, the first process chamber 330 is a deposition chamber, the second process chamber 340 is a CMP chamber, and the third process chamber 350 is an etch chamber.

The method 100 begins by disposing a substrate 202 having a dielectric material with at least one trench formed thereon in a first chamber.

Formation of the buffer layer 212, as described in operation 110 of FIG. 1 and shown in FIG. 2B, occurs in the first process chamber 330. Formation of the isolation layer 214 and a first overfill using an isolation material, as described in operation 120 of FIG. 1 and shown in FIG. 2B, also occurs in the first process chamber 330. After deposition of the buffer layer 212 and isolation layer 214, the substrate 202 may optionally be planarized. Prior to planarization, the device would be transferred from the first process chamber 330 to the second process chamber 340 via the wafer transferring mechanism 312, wherein the chemical mechanical polishing would occur. Removal of a portion of the isolation layer 214 to form a second trench 220, as described in operation 140 of FIG. 1 and shown in FIG. 2D, occurs in the third process chamber 350. The device is then transferred back to the first process chamber 330 via the wafer transferring mechanism 312 and the channel layer 216 and a second overfill are formed over the isolation layer 214, as described in operation 150 and shown in FIG. 2E. After deposition of the channel layer 216, the device is transferred back to the second process chamber 340, wherein the substrate 202 is planarized, as described in operation 170 of FIG. 1 and shown in FIG. 2F. Etching of the dielectric material 204 to expose the channel layer 216 and at least a portion of the isolation layer 214 occurs in the third process chamber 350. After the dielectric material 204 has been etched, an optional deposition of a second dielectric material 218 may occur in the first process chamber 330.

Use of the single apparatus 300 containing process chambers 330, 340, and 350 allows for the various stages of the method of FIG. 1 to occur without breaking vacuum. More specifically, the vacuum need only be broken during the chemical mechanical polishing/planarization processes depicted in FIGS. 2C and 2F.

Thus, methods are described for forming channels comprising Group III-V elements on a silicon substrate are provided. Benefits of this disclosure include precise fin size control in devices, such as sub-7 nm CMOS devices, and increased overall device yield.

While the foregoing is directed to embodiments of the present disclosure, other and further embodiments of the disclosure may be devised without departing from the basic scope thereof, and the scope thereof is determined by the claims that follow.

What is claimed is:

1. A method, comprising:
   depositing a buffer layer in a first trench and in a second trench formed in a dielectric material on a substrate;
   depositing an isolation layer over the buffer layer in the first trench and in the second trench;
   overfilling the first trench and the second trench with the isolation layer;
   removing a portion of the isolation layer in the first trench and in the second trench to form a first recess in the first trench and a second recess in the second trench such that the isolation layer in the first trench has a first thickness and the isolation layer in the second trench has a second thickness, the first thickness being different than the second thickness;
depositing a channel material over the isolation layer in the first recess and in the second recess;
overfilling the first recess and the second recess with the channel material to form a channel layer and an overfill;
planarizing the substrate to remove the overfill such that a thickness of the channel layer in the first recess is equal to a thickness of the channel layer in the second recess; and
etching the dielectric material to expose the channel layer and at least a portion of the isolation layer.

2. The method of claim 1, wherein the buffer layer comprises at least one of GaAs and InP, and wherein the isolation layer is selected from the group consisting of InP, InAlAs and InGaAs.

3. The method of claim 1, wherein the first thickness and the second thickness of the isolation layer are between about 10 nanometers and about 200 nanometers.

4. The method of claim 1, wherein the channel layer is selected from the group consisting of InGaAs, InAs, InGaSb, InSb, and GaSb.

5. The method of claim 1, wherein the thickness of the channel layer is between about 10 nanometers and about 60 nanometers.

6. The method of claim 1, wherein a top surface of the buffer layer in the first trench is at a first vertical position and a top surface of the buffer layer in the second trench is at a second vertical position, and wherein the first vertical position is vertically offset from the second vertical position.

7. The method of claim 1, wherein a top surface of the isolation layer in the first trench is at a third vertical position and a top surface of the isolation layer in the second trench is at a fourth vertical position after the removing the portion of the isolation layer in the first trench and in the second trench, and wherein the third vertical position is planar with the fourth vertical position.

8. A method, comprising:
depositing a dielectric material on a substrate;
forming a first trench and a second trench in the dielectric material;
depositing a buffer layer in the first trench and in the second trench;
depositing an isolation material over the buffer layer in the first trench and in the second trench to form an isolation layer and a first overfill;
planarizing the substrate to remove the first overfill;
etching a portion of the isolation layer in the first trench and in the second trench to form a first recess in the first trench and a second recess in the second trench such that the isolation layer in the first trench has a first thickness and the isolation layer in the second trench has a second thickness, the first thickness being different than the second thickness;
depositing a channel material over the isolation layer in the first recess and in the second recess to form a channel layer and a second overfill;
planarizing the substrate to remove the second overfill such that a thickness of the channel layer in the first recess is equal to a thickness of the channel layer in the second recess; and
etching the dielectric material to expose the channel layer and at least a portion of the isolation layer.

9. The method of claim 8, wherein the buffer layer comprises GaAs, and wherein the first thickness and the second thickness of the isolation layer are between about 10 nanometers and about 200 nanometers.

10. The method of claim 8, wherein the channel layer is selected from the group consisting of InGaAs, InAs, InGaSb, InSb, and GaSb, and wherein the thickness of the channel layer is between about 10 nanometers and about 60 nanometers.

11. The method of claim 8, further comprising:
cleaning the exposed channel layer; and
depositing a second dielectric material in contact with the exposed channel layer, the exposed portion of the isolation layer, and the dielectric material.

12. The method of claim 11, wherein the second dielectric material comprises a material with a high dielectric constant.

13. The method of claim 8, wherein a top surface of the buffer layer in the first trench is at a first vertical position and a top surface of the buffer layer in the second trench is at a second vertical position, and wherein the first vertical position is vertically offset from the second vertical position.

14. The method of claim 8, wherein a top surface of the isolation layer in the first trench is at a third vertical position and a top surface of the isolation layer in the second trench is at a fourth vertical position after the etching the portion of the isolation layer in the first trench and in the second trench, and wherein the third vertical position is planar with the fourth vertical position.

15. A method, comprising:
disposing a substrate having a dielectric material with at least a first trench and a second trench formed thereon in a first chamber;
in the first chamber, forming a buffer layer in the first trench and in the second trench;
in the first chamber, forming an isolation material over the buffer layer in the first trench and in the second trench to form an isolation layer and a first overfill;
transferring the substrate to a second chamber;
in the second chamber, planarizing the substrate to remove the first overfill;
transferring the substrate to a third chamber;
in the third chamber, removing a portion of the isolation layer in the first trench and in the second trench to form a first recess in the first trench and a second recess in the second trench such that the isolation layer in the first trench has a first thickness and the isolation layer in the second trench has a second thickness, the first thickness being different than the second thickness;
transferring the substrate to the first chamber;
in the first chamber, adding a channel material over the isolation layer in the first recess and in the second recess to form a channel layer and a second overfill;
transferring the substrate to the second chamber;
in the second chamber, planarizing the substrate to remove the second overfill such that a thickness of the channel layer in the first recess is equal to a thickness of the channel layer in the second recess;
transferring the substrate to the third chamber; and
in the third chamber, removing the dielectric material to expose the channel layer and at least a portion of the isolation layer.

16. The method of claim 15, wherein the buffer layer comprises GaAs.

17. The method of claim 15, wherein the isolation layer is selected from the group consisting of InP, InAlAs, and InGaAs, and wherein the first thickness and the second thickness of the isolation layer are between about 10 nanometers and about 200 nanometers.

18. The method of claim 15, wherein the channel layer is selected from the group consisting of InGaAs, InAs, InGaSb, InSb, and GaSb, and wherein the thickness of the channel layer is between about 10 nanometers and about 60 nanometers.

19. The method of claim 15, wherein a top surface of the buffer layer in the first trench is at a first vertical position and a top surface of the buffer layer in the second trench is at a second vertical position, and wherein the first vertical position is vertically offset from the second vertical position.

20. The method of claim 15, wherein a top surface of the isolation layer in the first trench is at a third vertical position and a top surface of the isolation layer in the second trench is at a fourth vertical position after the removing the portion of the isolation layer in the first trench and in the second trench, and wherein the third vertical position is planar with the fourth vertical position.

* * * * *